United States Patent
Liu et al.

(10) Patent No.: US 11,088,229 B1
(45) Date of Patent: Aug. 10, 2021

(54) PIXEL DRIVING CIRCUIT AND MANUFACTURING METHOD THEREOF

(71) Applicant: Shenzhen China Star Optoelectronics Semiconductor Display Technology Co., Ltd., Guangdong (CN)

(72) Inventors: Mingjun Liu, Guangdong (CN); Tan Wang, Guangdong (CN)

(73) Assignee: Shenzhen China Star Optoelectronics Semiconductor Display Technology Co., Ltd., Guangdong (CN)

(*) Notice: Subject to any disclaimer, the term of this patent is extended or adjusted under 35 U.S.C. 154(b) by 23 days.

(21) Appl. No.: 16/649,997

(22) PCT Filed: Feb. 13, 2020

(86) PCT No.: PCT/CN2020/075140
§ 371 (c)(1),
(2) Date: Mar. 24, 2020

(51) Int. Cl.
*H01L 27/32* (2006.01)
*H01L 27/12* (2006.01)

(52) U.S. Cl.
CPC ........ *H01L 27/3248* (2013.01); *H01L 27/124* (2013.01); *H01L 27/1262* (2013.01); *H01L 27/3276* (2013.01)

(58) Field of Classification Search
CPC ............. H01L 27/3248; H01L 27/3276; H01L 27/124; H01L 27/1262
See application file for complete search history.

(56) References Cited

U.S. PATENT DOCUMENTS

| | | | | |
|---|---|---|---|---|
| 10,984,725 | B1* | 4/2021 | He | H01L 27/3276 |
| 2006/0097628 | A1* | 5/2006 | Suh | H01L 27/3211 |
| | | | | 313/504 |
| 2016/0314740 | A1* | 10/2016 | Wu | G09G 3/3291 |
| 2017/0039940 | A1* | 2/2017 | Han | G09G 3/3266 |
| 2017/0269783 | A1* | 9/2017 | Yang | G06F 3/0412 |
| 2017/0270853 | A1* | 9/2017 | Xiang | G09G 3/3275 |
| 2018/0308871 | A1* | 10/2018 | Wu | G09G 3/3233 |
| 2019/0348491 | A1* | 11/2019 | Chung | H01L 27/3279 |
| 2020/0119120 | A1* | 4/2020 | Feng | H01L 27/3272 |
| 2020/0410926 | A1* | 12/2020 | Li | G09G 3/325 |
| 2021/0056905 | A1* | 2/2021 | Liu | H01L 51/524 |
| 2021/0098446 | A1* | 4/2021 | He | H01L 27/1222 |
| 2021/0098549 | A1* | 4/2021 | Zhang | H01L 27/3262 |

* cited by examiner

*Primary Examiner* — Douglas M Menz
(74) *Attorney, Agent, or Firm* — Mark M. Friedman

(57) ABSTRACT

A pixel driving circuit and a manufacturing method thereof according to the present application use a process to manufacture a metal layer that includes a first metal pattern, a first shading pattern, a second metal pattern, a second shading pattern, a third shading pattern, and a third metal pattern on a substrate, and form a first anode pattern and a second anode pattern on a passivation layer, to form a drain of a first transistor, a drain of a second transistor, and a drain of a third transistor.

14 Claims, 3 Drawing Sheets

PIXEL DRIVING CIRCUIT AND MANUFACTURING METHOD THEREOF

FIELD OF INVENTION

The present application relates to the field of display technology, and specifically to a pixel driving circuit and a manufacturing method thereof.

BACKGROUND OF INVENTION

Organic light-emitting diode (OLED) display panels have advantages such as low power consumption, wide color gamut, high brightness, wide viewing angles, quick response times, etc., and hence are very popular in the market. OLED panels have multiple pixels arranged in an array, and each of the pixels needs to be driven through a pixel driving circuit. A conventional 3T1C pixel driving circuit (including 3 thin film transistors and 1 storage capacitor) can compensate a threshold voltage of a driving thin film transistor and make display brightness of the OLED panels more uniform.

However, in a manufacturing process of the conventional 3T1C pixel driving circuit, holes are required to be formed in multiple functional layers to realize connection between thin film transistors. The process is complicated, and hence leads to higher cost of production.

SUMMARY OF INVENTION

The present application mainly resolves a technical problem that a manufacturing process of a pixel driving circuit is complicated and the cost of production is high.

First, the present application provides a manufacturing method of a pixel driving circuit that includes providing a substrate; forming a metal layer and a buffer layer on the substrate, wherein the metal layer includes a first metal pattern, a first shading pattern, a second metal pattern, a second shading pattern, a third shading pattern, and a third metal pattern, the buffer layer includes a first buffer pattern, a second buffer pattern, and a third buffer pattern, the first buffer pattern corresponds to the second shading pattern, the second buffer pattern corresponds to the third shading pattern, and the third buffer pattern corresponds to the first shading pattern; providing a first transistor on the first buffer pattern, providing a second transistor on the second buffer pattern, and providing a third transistor on the third buffer pattern; depositing a passivation layer on the first transistor, the second transistor, and the third transistor; patterning the passivation layer to form a first via hole and a second via hole in the passivation layer, wherein the first via hole is correspondingly disposed at the first transistor, the first via hole penetrates the first transistor and extends to the metal layer, and the second via hole is correspondingly disposed between the first transistor and the second transistor; and forming a first anode pattern and a second anode pattern on the passivation layer, wherein the first anode pattern is connected to the metal layer through the first via hole to form a drain of the third transistor, and the second anode pattern is connected to the metal layer through the second via hole to form a drain of the first transistor and a drain of the second transistor.

In a manufacturing method according to the present application, the step of forming the metal layer and the buffer layer on the substrate includes depositing a layer of the metal layer on the substrate; patterning the metal layer deposited on the substrate to form the metal layer with patterned structure on the substrate, wherein the metal layer includes the first metal pattern, the first shading pattern, the second metal pattern, the third shading pattern, and the second metal pattern spaced apart from each other; depositing the buffer layer on the metal layer, and patterning the buffer layer deposited on the substrate to expose the first metal pattern, the second metal pattern, the second shading pattern, and a part of the third metal pattern.

In a manufacturing method according to the present application, the steps of providing the first transistor on the first buffer pattern, providing the second transistor on the second buffer pattern, and providing the third transistor on the third buffer pattern includes depositing a channel material on the buffer layer; patterning the deposited channel material to form a first channel pattern, a second channel pattern, and a third channel pattern on the buffer layer; providing a gate pattern on the first channel pattern, on the second channel pattern, and on the third channel pattern respectively to form a first gate pattern on the first channel pattern, a second gate pattern on the second channel pattern, and a third gate pattern on the third channel pattern.

In a manufacturing method according to the present application, the step of patterning the passivation layer to form the first via hole and the second via hole in the passivation layer includes coating a photoresist layer on the passivation layer; exposing and developing the photoresist layer by using a mask to obtain the processed photoresist layer; based on the processed photoresist layer, etching the passivation layer to form the first via hole and the second via hole in the passivation layer.

In a manufacturing method according to the present application, the step of based on the processed photoresist layer, etching the passivation layer to form the first via hole and the second via hole in the passivation layer includes etching the passivation layer, a first gate pattern, and a first insulating pattern by taking the processed photoresist layer as a mask to obtain the first via hole and the second via hole.

In a manufacturing method according to the present application, the step of forming the first anode pattern and the second anode pattern on the passivation layer includes depositing an anode material on the passivation layer, the first via hole, and the second via hole to obtain an anode layer; patterning the anode layer to form the first anode pattern and the second anode pattern on the passivation layer, wherein the first anode pattern is connected to the metal layer through the first via hole to form the drain of the third transistor, and the second anode pattern is connected to the metal layer through the second via hole to form the drain of the first transistor and the drain of the second transistor.

Second, the present application provides a pixel driving circuit that includes a substrate; a metal layer disposed on the substrate, wherein the metal layer includes a first metal pattern, a first shading pattern, a second metal pattern, a second shading pattern, a third shading pattern, and a third metal pattern spaced apart from each other; a buffer layer disposed on the metal layer, wherein the buffer layer includes a first buffer pattern, a second buffer pattern, and a third buffer pattern, wherein the first buffer pattern corresponds to the second shading pattern, the second buffer pattern corresponds to the third shading pattern, and the third buffer pattern corresponds to the first shading pattern; a channel layer disposed on the buffer layer, wherein the source/drain layer includes a first channel pattern, a second channel pattern, and a third channel pattern, wherein the first channel pattern corresponds to the second shading pattern, the second channel pattern corresponds to the third shading pattern, and the third channel pattern corresponds to the first shading pattern; a gate layer disposed on the channel layer, wherein the gate layer includes a first gate pattern, a second gate pattern, and a third gate pattern spaced apart from each other, wherein the first gate pattern is disposed on the first channel pattern, the second gate pattern is disposed on the second channel pattern, and the third gate pattern is disposed on the third channel pattern; a passivation layer disposed on the gate layer and covering the channel layer and the buffer layer; and an anode layer disposed on the passivation layer, wherein the anode layer includes a first anode pattern and a second anode pattern; wherein a first via hole and a second via hole are further formed in the passivation layer, the first via hole penetrates the passivation layer and the first gate pattern, the second via hole penetrates the passivation layer, the first anode pattern is connected to the second metal pattern through the first via hole to form a drain of a third transistor, and the second anode pattern is connected to the second shading pattern through the second via hole to form a drain of a first transistor and a drain of a second transistor; wherein an insulating layer is further disposed between the source/drain layer and the gate layer, and the insulating layer includes a first insulating pattern, a second insulating pattern, and a third insulating pattern spaced apart from each other; wherein the first channel pattern, the first insulating pattern, and the first gate pattern are stacked on the first buffer pattern, the second channel pattern, the second insulating pattern, and the second gate pattern are stacked on the second buffer pattern, and the third channel pattern, the third insulating pattern, and the third gate pattern are stacked on the third buffer pattern, wherein the first gate pattern is electrically connected to the third channel pattern through the first anode pattern, the first channel pattern is electrically connected to the second channel pattern through the second shading pattern, the second shading pattern is connected to the second anode pattern, and the third channel pattern is connected to the first anode pattern through the second metal pattern; and wherein a material of the channel layer includes oxide semiconductor and polycrystalline silicon.

In a pixel driving circuit according to the present application, the first metal pattern, the first shading pattern, the second metal pattern, the second shading pattern, the third shading pattern, and the third metal pattern are spaced apart sequentially; and wherein the first buffer pattern is disposed on the second shading pattern, and a part of the first buffer pattern is disposed along a gap between the second metal pattern and the second shading pattern, the second buffer pattern is disposed on the third shading pattern, a part of the second buffer pattern is disposed along a gap between the second shading pattern and the third shading pattern, and another part of the second buffer pattern is disposed along a gap between the third shading pattern and the third metal pattern, and the third buffer pattern is disposed on the first shading pattern, a part of the third buffer pattern is disposed along a gap between the first metal pattern and the first shading pattern, and another part of the third buffer pattern is disposed along a gap between the first shading pattern and the second metal pattern.

In a pixel driving circuit according to the present application, in a direction perpendicular to the substrate, an overlapping area of the third gate pattern and the first shading pattern forms a storage capacitor.

Third, the present application provides a pixel driving circuit that includes a substrate; a metal layer disposed on the substrate, wherein the metal layer includes a first metal pattern, a first shading pattern, a second metal pattern, a second shading pattern, a third shading pattern, and a third metal pattern spaced apart from each other; a buffer layer disposed on the metal layer, wherein the buffer layer includes a first buffer pattern, a second buffer pattern, and a third buffer pattern, wherein the first buffer pattern corresponds to the second shading pattern, the second buffer pattern corresponds to the third shading pattern, and the third buffer pattern corresponds to the first shading pattern; a channel layer disposed on the buffer layer, wherein the source/drain layer includes a first channel pattern, a second channel pattern, and a third channel pattern, wherein the first channel pattern corresponds to the second shading pattern, the second channel pattern corresponds to the third shading pattern, and the third channel pattern corresponds to the first shading pattern; a gate layer disposed on the channel layer, wherein the gate layer includes a first gate pattern, a second gate pattern, and a third gate pattern spaced apart from each other, wherein the first gate pattern is disposed on the first channel pattern, the second gate pattern is disposed on the second channel pattern, and the third gate pattern is disposed on the third channel pattern; a passivation layer disposed on the gate layer and covering the channel layer and the buffer layer; and an anode layer disposed on the passivation layer, wherein the anode layer includes a first anode pattern and a second anode pattern; wherein a first via hole and a second via hole are further formed in the passivation layer, the first via hole penetrates the passivation layer and the first gate pattern, the second via hole penetrates the passivation layer, the first anode pattern is connected to the second metal pattern through the first via hole to form a drain of a third transistor, and the second anode pattern is connected to the second shading pattern through the second via hole to form a drain of a first transistor and a drain of a second transistor.

In a pixel driving circuit according to the present application, an insulating layer is further disposed between the source/drain layer and the gate layer, and the insulating layer includes a first insulating pattern, a second insulating pattern, and a third insulating pattern spaced apart from each other; and wherein the first channel pattern, the first insulating pattern, and the first gate pattern are stacked on the first buffer pattern, the second channel pattern, the second insulating pattern, and the second gate pattern are stacked on the second buffer pattern, and the third channel pattern, the third insulating pattern, and the third gate pattern are stacked on the third buffer pattern, wherein the first gate pattern is electrically connected to the third channel pattern through the first anode pattern, the first channel pattern is electrically connected to the second channel pattern through the second shading pattern, the second shading pattern is connected to the second anode pattern, and the third channel pattern is connected to the first anode pattern through the second metal pattern.

In a pixel driving circuit according to the present application, the first metal pattern, the first shading pattern, the second metal pattern, the second shading pattern, the third shading pattern, and the third metal pattern are spaced apart sequentially; and wherein the first buffer pattern is disposed on the second shading pattern, and a part of the first buffer pattern is disposed along a gap between the second metal pattern and the second shading pattern, the second buffer pattern is disposed on the third shading pattern, a part of the second buffer pattern is disposed along a gap between the second shading pattern and the third shading pattern, and another part of the second buffer pattern is disposed along a gap between the third shading pattern and the third metal pattern, and the third buffer pattern is disposed on the first shading pattern, a part of the third buffer pattern is disposed along a gap between the first metal pattern and the first shading pattern, and another part of the third buffer pattern is disposed along a gap between the first shading pattern and the second metal pattern.

In a pixel driving circuit according to the present application, in a direction perpendicular to the substrate, an overlapping area of the third gate pattern and the first shading pattern forms a storage capacitor.

In a pixel driving circuit according to the present application, a material of the channel layer includes oxide semiconductor and polycrystalline silicon.

Beneficial effects of the present application are as follows: through using a process to manufacture a metal layer that includes a first metal pattern, a first shading pattern, a second metal pattern, a second shading pattern, a third shading pattern, and a third metal pattern on a substrate, and forming a first anode pattern and a second anode pattern on a passivation layer, wherein the first anode pattern is connected to the metal layer through a first via hole to form a drain of a third transistor, and the second anode pattern is connected to the metal layer through a second via hole to form a drain of a first transistor and a drain of a second transistor, manufacturing processes are reduced, which not only increases efficiency of production, but also decreases cost of production.

DESCRIPTION OF DRAWINGS

The accompanying figures to be used in the description of embodiments of the present application will be described in brief to more clearly illustrate the technical solutions of the embodiments. The accompanying figures described below are only part of the embodiments of the present application, from which those skilled in the art can derive further figures without making any inventive efforts.

DETAILED DESCRIPTION OF PREFERRED EMBODIMENTS

Embodiments of the present application are described in detail as follows, the embodiments are illustrated in the accompanying drawings, and identical or similar numerals represent identical or similar elements or elements having identical or similar functions. The following embodiments described with reference to accompanying drawings are illustrative, only for explanation of the present application, and not construed as limiting of the present application.

Figure 1:
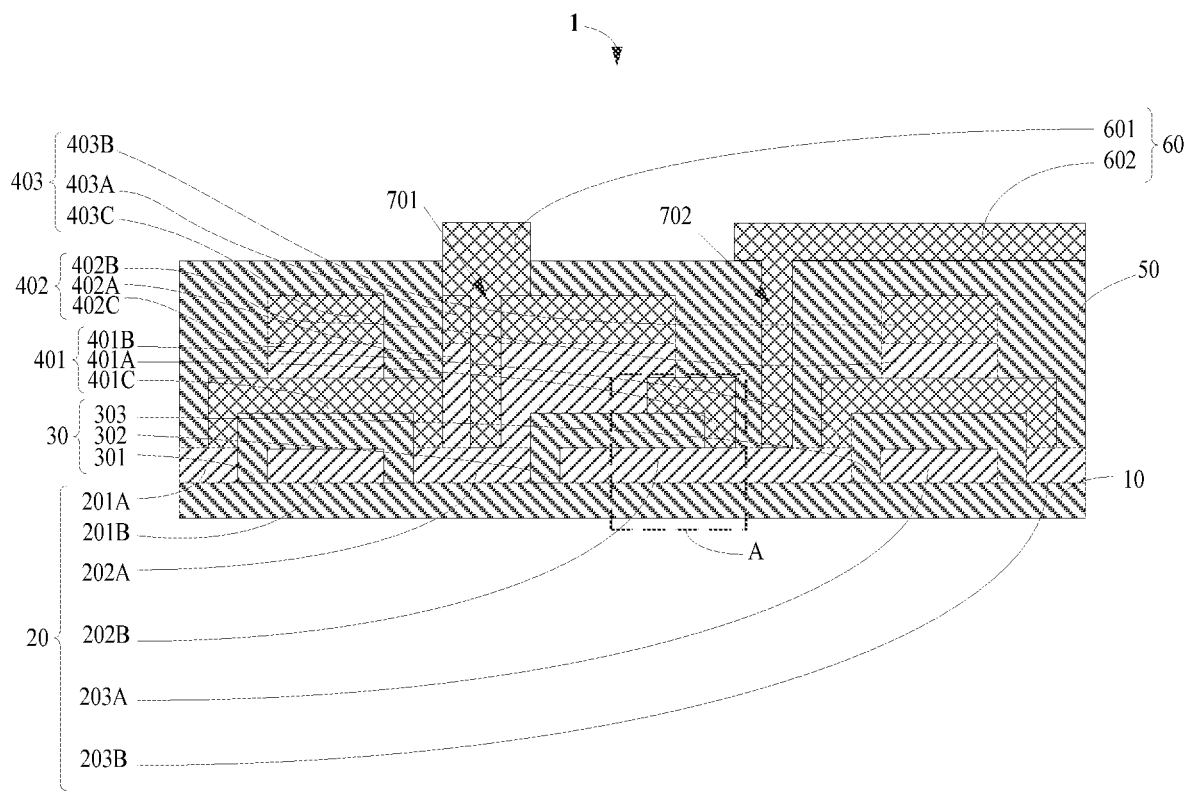
FIG. 1 is a structural schematic diagram of a pixel driving circuit according to the present application.

Referring to FIG. 1, FIG. 1 is a structural schematic diagram of a pixel driving circuit according to the present application. The present application provides a pixel driving circuit 1, and the pixel driving circuit 1 includes a substrate 10, a metal layer 20, a buffer layer 30, a channel layer 401, a passivation layer 50, and an anode layer 60.

Wherein, the metal layer 20 is disposed on the substrate 10, and the metal layer 20 can include a first metal pattern 201A, a first shading pattern 201B, a second metal pattern 202A, a second shading pattern 202B, a third shading pattern 203A, and a third metal pattern 203B. The buffer layer 30 is disposed on the metal layer 20, and the buffer layer 30 can include a first buffer pattern 301, a second buffer pattern 302, and a third buffer pattern 303. The first buffer pattern 301 corresponds to the second shading pattern 202B, the second buffer pattern 302 corresponds to the third shading pattern 203B, and the third buffer pattern 303 corresponds to the first shading pattern 201B. The channel layer 401 is disposed on the buffer layer 30, and the channel layer 401 includes a first channel pattern 401A, a second channel pattern 401B, and a third channel pattern 401C. The first channel pattern 401A corresponds to the second shading pattern 202B, the second channel pattern 401B corresponds to the third shading pattern 203B, and the third channel pattern 401C corresponds to the first shading pattern 201B. A gate layer 403 is disposed on the channel layer 401, and the gate layer 403 includes a first gate pattern 403A, a second gate pattern 403B, and a third gate pattern 403C spaced apart from each other. It should be explained that an insulating layer 402 is further disposed between the gate layer 403 and the channel layer 401, and the insulating layer 402 is configured to insulate the gate layer 403 from the channel layer 401. The insulating layer 402 can specifically include a first insulating pattern 402A, a second insulating pattern 402B, and a third insulating pattern 402C spaced apart from each other. The passivation layer 50 is disposed on the gate layer 403, and the passivation layer 50 covers the channel layer 401 and the buffer layer 30. The anode layer 60 is disposed on the passivation layer 50, and the anode layer 60 can include a first anode pattern 601 and a second anode pattern 602, wherein, a first via hole 701 and a second via hole 702 are further formed in the passivation layer 50. The first anode pattern 601 is connected to the second metal pattern 202A through the first via hole 701 to form a drain of a third transistor T3, and the second anode pattern 602 is connected to the second shading pattern 202B through the second via hole 702 to form a drain of a first transistor T1 and a drain of a second transistor T2.

Furthermore, the first channel pattern 401A, the first insulating pattern 402A, and the first gate pattern 403A are stacked on the first buffer pattern 301. The second channel pattern 401B, the second insulating pattern 402B, and the second gate pattern 403B are stacked on the second buffer pattern 302. The third channel pattern 401C, the third insulating pattern 402C, and the third gate pattern 403C are stacked on the third buffer pattern 303. The first gate pattern 403A is electrically connected to the third channel pattern 401C through the first anode pattern 601, the first channel pattern 401A is electrically connected to the second channel pattern 401B through the second shading pattern 202B, the second shading pattern 202B is connected to the second anode pattern 602, and the third channel pattern 401C is connected to the first anode pattern 601 through the second metal pattern 202A.

In some embodiments, the first metal pattern 201A, the first shading pattern 201B, the second metal pattern 202A, the second shading pattern 202B, the third shading pattern 203A, and the third metal pattern 203B are spaced apart sequentially. The first buffer pattern 301 is disposed on the second shading pattern 202B, and a part of the first buffer pattern 301 is disposed along a gap between the second metal pattern 202A and the second shading pattern 202B. The second buffer pattern 302 is disposed on the third shading pattern 203B, a part of the second buffer pattern 302 is disposed along a gap between the second shading pattern 202B and the third shading pattern 203B, and another part of the second buffer pattern 302 is disposed along a gap between the third shading pattern 203B and the third metal pattern 203A. The third buffer pattern 303 is disposed on the first shading pattern 201B, a part of the third buffer pattern 303 is disposed along a gap between the first metal pattern 201A and the first shading pattern 201B, and another part of the third buffer pattern 303 is disposed along a gap between the first shading pattern 201B and the second metal pattern 202A.

In some embodiments, a material of the channel layer 401 includes oxide semiconductor and polycrystalline silicon.

In some embodiments, in a direction perpendicular to the substrate as an arrow a shows, an overlapping area between the third gate pattern 403C and the first shading pattern 201B forms a storage capacitor Cst.

Figure 2:
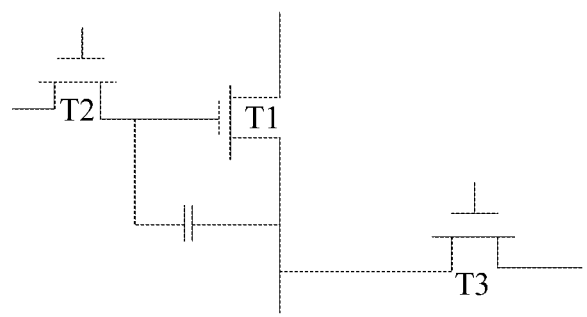
FIG. 2 is an equivalent circuit diagram of the pixel driving circuit of FIG. 1.

Referring to FIG. 1, and also referring to FIG. 2, FIG. 2 is an equivalent circuit diagram of the pixel driving circuit of FIG. 1. A process of the present application is manufacturing the metal layer 20 including the first metal pattern 201A, the first shading pattern 201B, the second metal pattern 202A, the second shading pattern 202B, the third shading pattern 203A, and the third metal pattern 203B on the substrate 10, and forming the first anode pattern 601 and the second anode pattern 602 on the passivation layer 50. The first anode pattern 601 is connected to the second metal pattern 202A through the first via hole 701 to form the drain of the third transistor T3, and the second anode pattern 602 is connected to the second shading pattern 202B through the second via hole 702 to form the drain of the first transistor T1 and the drain of the second transistor T2. That is, a gate of the first transistor T1 and the drain of the third transistor T3 can realize electrical connection through the second anode pattern 602 and the second metal pattern 202A. Therefore, manufacturing processes are reduced, which not only increases efficiency of production, but also decreases cost of production.

Figure 3:
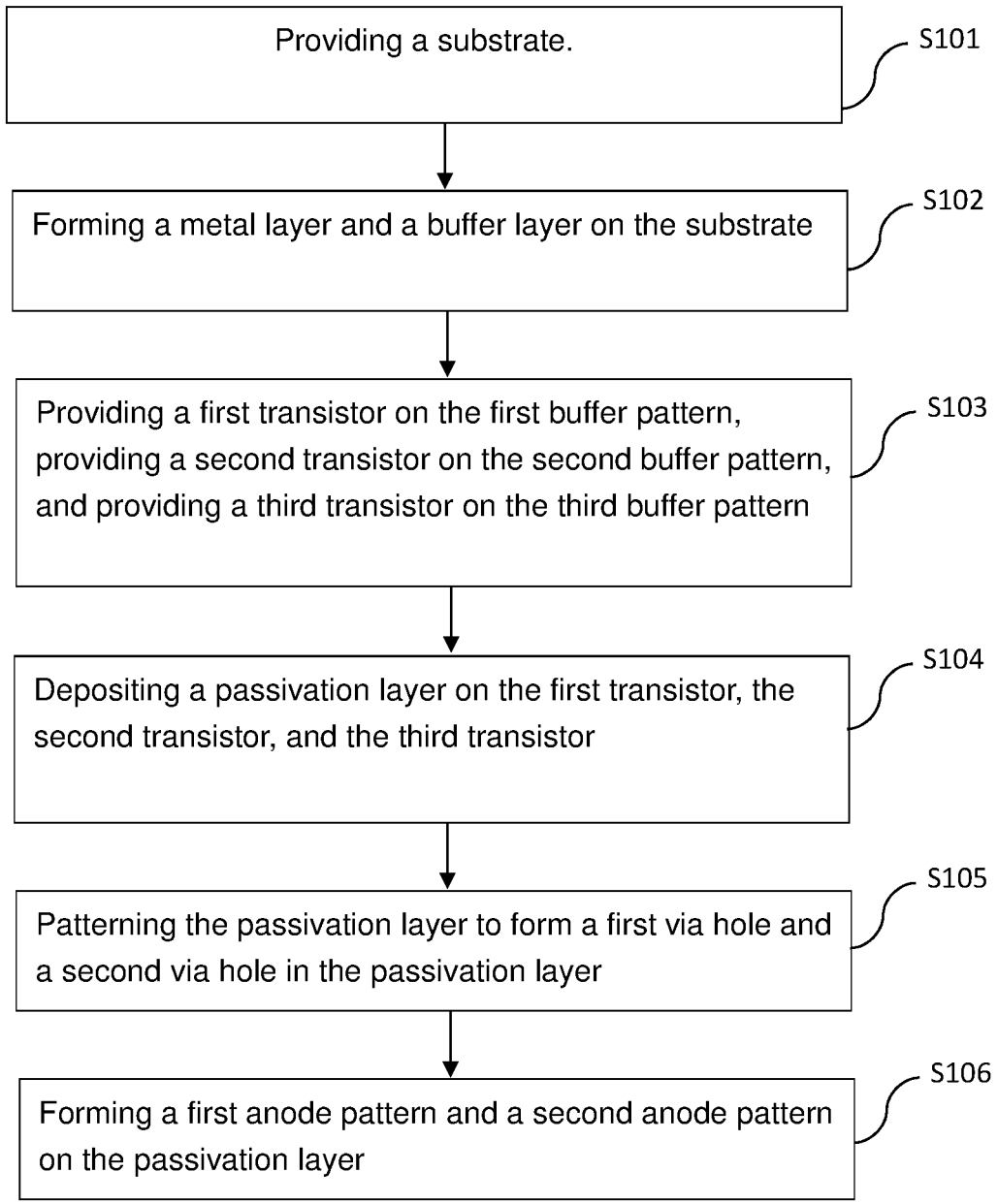
FIG. 3 is a flowchart of a pixel driving circuit according to the present application.

Referring again to FIG. 1, and also referring to FIG. 3, FIG. 3 is a flowchart of a pixel driving circuit according to the present application. The present application provides a manufacturing method of a pixel driving circuit that can specifically include following steps:

A manufacturing method of a pixel driving circuit includes S101, providing a substrate. The substrate 10 can be a glass substrate, a quartz substrate, a resin substrate, or other types of substrates, and detailed description is omitted here. S102, forming a metal layer and a buffer layer on the substrate. First, a metal layer can be deposited on the substrate 10, and then the metal layer 20 deposited on the substrate 10 is patterned. A material of the metal layer 20 is a metal that has favorable electrical conductivity and shading property, and is generally molybdenum, copper, aluminum, or metal complexes. For example, the metal layer 20 can be etched through a mask, and after etching the metal layer 20 can include a first metal pattern 201A, a first shading pattern 201B, a second metal pattern 202A, a second shading pattern 202B, a third shading pattern 203A, and a third metal pattern 203B. Then, a buffer layer 30 is deposited on the metal layer 20, and the buffer layer 30 is patterned to expose the first metal pattern 201A, the second metal pattern 202A, the second shading pattern 202B, and a part of the third metal pattern 203B, as shown in FIG. 1. That is, in some embodiments, the step of "forming the metal layer and the buffer layer on the substrate" can specifically include (11), depositing a layer of the metal layer on the substrate; (12), patterning the metal layer deposited on the substrate to form the metal layer with patterned structure on the substrate; and (13), depositing the buffer layer on the metal layer, and patterning the buffer layer deposited on the substrate to expose the first metal pattern, the second metal pattern, the second shading pattern, and a part of the third metal pattern.

The buffer layer 30 includes a first buffer pattern 301, a second buffer pattern 302, and a third buffer pattern 303. The first buffer pattern 301 corresponds to the second shading pattern 202B, the second buffer pattern 302 corresponds to the third shading pattern 203B, and the third buffer pattern 303 corresponds to the first shading pattern 201B, as shown in FIG. 1.

S103, providing a first transistor on the first buffer pattern, providing a second transistor on the second buffer pattern, and providing a third transistor on the third buffer pattern.

A channel layer 401 is deposited on the patterned buffer layer 30. The conductive channel layer 401 is patterned to form a first channel pattern 401A, a second channel pattern 401B, and a third channel pattern 401C. Wherein, a material of the channel layer 401 can be oxide semiconductor, polycrystalline silicon, amorphous silicon, etc. Specifically, the oxide semiconductor can be indium gallium zinc oxide (IGZO), indium tin zinc oxide (ITZO), ZnO, etc.

That is, in some embodiments, the step of "providing the first transistor on the first buffer pattern, providing the second transistor on the second buffer pattern, and providing the third transistor on the third buffer pattern" can specifically include (21), depositing a channel material on the buffer layer; (22), patterning the deposited channel material to form a first channel pattern, a second channel pattern, and a third channel pattern on the buffer layer; and (23), providing a gate pattern on the first channel pattern, on the second channel pattern, and on the third channel pattern, respectively, to form a first gate pattern on the first channel pattern, a second gate pattern on the second channel pattern, and a third gate pattern on the third channel pattern.

Please refer to specific structures in the above-mentioned embodiment and detailed description is omitted here.

It should be explained that the first buffer pattern completely covers the first shading pattern 201B, and isolates the first metal pattern 201A from the second metal pattern 202A to have an effect of isolation.

Then, a first insulating pattern 402A, a second insulating pattern 402B, a third insulating pattern 402C, the first gate pattern 403A, the second gate pattern 403B, and the third gate pattern 403C are correspondingly formed on the first channel pattern 401A, the second channel pattern 401B, and the third channel pattern 401C, as shown in FIG. 1. Furthermore, the second buffer pattern 302 is disposed at a gap between the second metal pattern 202A and the second shading pattern 202B, and covers a part of the second shading pattern 202B, which not only isolates the second metal pattern 202A from the second shading pattern 202B, but the second channel pattern 401B is also electrically connected to the second channel pattern 401C through the second shading pattern 202B.

It should be explained that, in some embodiments, after the first insulating pattern 402A, the second insulating pattern 402B, and the third insulating pattern 402C are formed on the first channel pattern 401A, the second channel pattern 401B, and the third channel pattern 401C, respectively, the first insulating pattern 402A, the second insulating pattern 402B, and the third insulating pattern 402C can be used as masks to manufacture the first gate pattern 403A, the second gate pattern 403B, and the third gate pattern 403C, thereby further simplifying processes, and hence increasing efficiency of production.

S104, depositing a passivation layer on the first transistor, the second transistor, and the third transistor.

For example, the passivation layer 50 can be deposited on the first transistor T1, the second transistor T2, and the third transistor T3 through a chemical vapor deposition process, and a material of the passivation layer 50 can be silica, silicon nitride, a stacked structure of silica and silicon nitride, etc. Please refer to specific structures in FIG. 1 and detailed description is omitted here.

S105, patterning the passivation layer to form a first via hole and a second via hole in the passivation layer.

For example, the first via hole 701 and the second via hole 702 can be formed through etching the passivation layer 50. That is, in some embodiments, the step of "patterning the passivation layer to form the first via hole and the second via hole in the passivation layer" can specifically include (31), coating a photoresist layer on the passivation layer; (32), exposing and developing the photoresist layer by using a mask to obtain the processed photoresist layer; and (33), based on the processed photoresist layer, etching the passivation layer to form the first via hole and the second via hole in the passivation layer.

Specifically, first, a photoresist layer is deposited on the passivation layer 50, and the photoresist layer is exposed and developed using a mask. The mask can include clear areas and dark areas and a material of the photoresist layer can be a positive photoresist or a negative photoresist, configured depending on practical conditions. Then, the passivation layer 50 is etched using the photoresist layer being exposed and developed as a mask to form the first via hole 701 and the second via hole 702 in the passivation layer 50. Wherein, the first via hole 701 is correspondingly positioned at the first transistor T1 and penetrates the first gate pattern 403A and the first insulating pattern 402A, and the second via hole 702 is correspondingly positioned between the first transistor T1 and the second transistor T2, as shown in FIG. 1. That is, the step of "based on the processed photoresist layer, etching the passivation layer to form the first via hole and the second via hole in the passivation layer" can specifically include etching the passivation layer, the first gate pattern, and the first insulating pattern by taking the processed photoresist layer as a mask to obtain the first via hole and the second via hole.

S106, forming a first anode pattern and a second anode pattern on the passivation layer.

Figure 4:
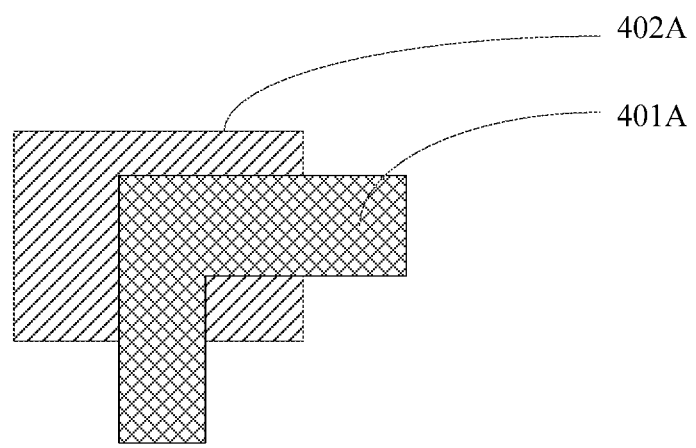
FIG. 4 is a sectional view of a first transistor T1 in an area shown in FIG. 1.

Specifically, an anode layer can be deposited on the passivation layer 50, and the anode layer is patterned to form the first anode pattern 601 and the second anode pattern 602 on the passivation layer 50. Wherein, the first anode pattern 601 is connected to the metal layer 20 through the first via hole 701; specifically, the first anode pattern 601 can be connected to the second metal pattern 202A through the first via hole 701 to make the second metal pattern 202A and a part of the third channel pattern 401C be the drain of the third transistor T3. The second anode pattern 602 is connected to the metal layer 20 through the second via hole 702; specifically, the second anode pattern 602 can be connected to the second shading pattern 202B through the second via hole 702 to make a part of the second shading pattern 202B and a part of the first channel pattern 401A be the drain of the first transistor T1, as shown in FIG. 4. FIG. 4 is a sectional view of a first transistor T1 in an area shown in FIG. 1. Furthermore, a part of the second shading pattern 202B and a part of the second channel pattern 401B are made to be the drain of the second transistor T2.

That is, in some embodiments, the step of "forming the first anode pattern and the second anode pattern on the passivation layer" can specifically include (41), depositing an anode material on the passivation layer, the first via hole, and the second via hole to obtain the anode layer; and (42), patterning the anode layer to form the first anode pattern and the second anode pattern on the passivation layer.

The present application provides a pixel driving circuit and a manufacturing method thereof. The manufacturing method includes providing a substrate; forming a metal layer and a buffer layer on the substrate; providing a first transistor on the first buffer pattern, providing a second transistor on the second buffer pattern, and providing a third transistor on the third buffer pattern; depositing a passivation layer on the first transistor, the second transistor, and the third transistor; patterning the passivation layer to form a first via hole and a second via hole in the passivation layer; and forming a first anode pattern and a second anode pattern on the passivation layer. The present application, through using a process to manufacture a first metal pattern 201A, a first shading pattern 201B, a second metal pattern 202A, a second shading pattern 202B, a third shading pattern 203A, and a third metal pattern 203B, reduces manufacturing processes, which not only increases efficiency of production, but also decreases cost of production.

Although the present application has been explained in relation to its preferred embodiment, it does not intend to limit the present application. It will be apparent to those skilled in the art having regard to this present application that other modifications of the exemplary embodiments beyond these embodiments specifically described here may be made without departing from the spirit of the application. Accordingly, such modifications are considered within the scope of the application as limited solely by the appended claims.

What is claimed is:

1. A manufacturing method of a pixel driving circuit, comprising:
   providing a substrate;
   forming a metal layer and a buffer layer on the substrate, wherein the metal layer comprises a first metal pattern, a first shading pattern, a second metal pattern, a second shading pattern, a third shading pattern, and a third metal pattern, the buffer layer comprises a first buffer pattern, a second buffer pattern, and a third buffer pattern, the first buffer pattern corresponds to the second shading pattern, the second buffer pattern corresponds to the third shading pattern, and the third buffer pattern corresponds to the first shading pattern;
   providing a first transistor on the first buffer pattern, providing a second transistor on the second buffer pattern, and providing a third transistor on the third buffer pattern;
   depositing a passivation layer on the first transistor, the second transistor, and the third transistor;
   patterning the passivation layer to form a first via hole and a second via hole in the passivation layer, wherein the first via hole is correspondingly positioned at the first transistor, the first via hole penetrates the first transistor and extends to the metal layer, and the second via hole is correspondingly positioned between the first transistor and the second transistor; and
   forming a first anode pattern and a second anode pattern on the passivation layer, wherein the first anode pattern is connected to the metal layer through the first via hole to form a drain of the third transistor, and the second anode pattern is connected to the metal layer through the second via hole to form a drain of the first transistor and a drain of the second transistor.

2. The manufacturing method as claimed in claim 1, wherein the step of forming the metal layer and the buffer layer on the substrate comprises:
   depositing a layer of the metal layer on the substrate;

patterning the metal layer deposited on the substrate to form the metal layer with patterned structure on the substrate, wherein the metal layer comprises the first metal pattern, the first shading pattern, the second metal pattern, the third shading pattern, and the second metal pattern spaced apart from each other; and depositing the buffer layer on the metal layer, and patterning the buffer layer deposited on the substrate to expose the first metal pattern, the second metal pattern, the second shading pattern, and a part of the third metal pattern.

3. The manufacturing method as claimed in claim 1, wherein the step of providing the first transistor on the first buffer pattern, providing the second transistor on the second buffer pattern, and providing the third transistor on the third buffer pattern comprises:

depositing a channel material on the buffer layer;
patterning the deposited channel material to form a first channel pattern, a second channel pattern, and a third channel pattern on the buffer layer; and
providing a gate pattern on the first channel pattern, on the second channel pattern, and on the third channel pattern, respectively, to form a first gate pattern on the first channel pattern, a second gate pattern on the second channel pattern, and a third gate pattern on the third channel pattern.

4. The manufacturing method as claimed in claim 2, wherein the step of patterning the passivation layer to form the first via hole and the second via hole in the passivation layer comprises:

coating a photoresist layer on the passivation layer;
exposing and developing the photoresist layer by using a mask to obtain a processed photoresist layer; and
based on the processed photoresist layer, etching the passivation layer to form the first via hole and the second via hole in the passivation layer.

5. The manufacturing method as claimed in claim 4, wherein the step of based on the processed photoresist layer, etching the passivation layer to form the first via hole and the second via hole in the passivation layer comprises:

etching the passivation layer, a first gate pattern, and a first insulating pattern by taking the processed photoresist layer as a mask to obtain the first via hole and the second via hole.

6. The manufacturing method as claimed in claim 1, wherein the step of forming the first anode pattern and the second anode pattern on the passivation layer comprises:

depositing an anode material on the passivation layer, the first via hole, and the second via hole to obtain an anode layer; and
patterning the anode layer to form the first anode pattern and the second anode pattern on the passivation layer, wherein the first anode pattern is connected to the metal layer through the first via hole to form the drain of the third transistor, and the second anode pattern is connected to the metal layer through the second via hole to form the drain of the first transistor and the drain of the second transistor.

7. A pixel driving circuit, comprising:
a substrate;
a metal layer disposed on the substrate, wherein the metal layer comprises a first metal pattern, a first shading pattern, a second metal pattern, a second shading pattern, a third shading pattern, and a third metal pattern spaced apart from each other;
a buffer layer disposed on the metal layer, wherein the buffer layer comprises a first buffer pattern, a second buffer pattern, and a third buffer pattern, the first buffer pattern corresponds to the second shading pattern, the second buffer pattern corresponds to the third shading pattern, and the third buffer pattern corresponds to the first shading pattern;

a channel layer disposed on the buffer layer, wherein the source/drain layer comprises a first channel pattern, a second channel pattern, and a third channel pattern, the first channel pattern corresponds to the second shading pattern, the second channel pattern corresponds to the third shading pattern, and the third channel pattern corresponds to the first shading pattern;

a gate layer disposed on the channel layer, wherein the gate layer comprises a first gate pattern, a second gate pattern, and a third gate pattern spaced apart from each other, the first gate pattern is disposed on the first channel pattern, the second gate pattern is disposed on the second channel pattern, and the third gate pattern is disposed on the third channel pattern;

a passivation layer disposed on the gate layer and covering the channel layer and the buffer layer; and an anode layer disposed on the passivation layer, wherein the anode layer comprises a first anode pattern and a second anode pattern;

wherein a first via hole and a second via hole are further formed in the passivation layer, the first via hole penetrates the passivation layer and the first gate pattern, the second via hole penetrates the passivation layer, the first anode pattern is connected to the second metal pattern through the first via hole to form a drain of a third transistor, and the second anode pattern is connected to the second shading pattern through the second via hole to form a drain of a first transistor and a drain of a second transistor;

wherein an insulating layer is further disposed between the source/drain layer and the gate layer, and the insulating layer comprises a first insulating pattern, a second insulating pattern, and a third insulating pattern spaced apart from each other;

wherein the first channel pattern, the first insulating pattern, and the first gate pattern are stacked on the first buffer pattern, the second channel pattern, the second insulating pattern, and the second gate pattern are stacked on the second buffer pattern, the third channel pattern, the third insulating pattern, and the third gate pattern are stacked on the third buffer pattern, the first gate pattern is electrically connected to the third channel pattern through the first anode pattern, the first channel pattern is electrically connected to the second channel pattern through the second shading pattern, the second shading pattern is connected to the second anode pattern, and the third channel pattern is connected to the first anode pattern through the second metal pattern; and wherein a material of the channel layer comprises oxide semiconductor and polycrystalline silicon.

8. The pixel driving circuit as claimed in claim 7, wherein the first metal pattern, the first shading pattern, the second metal pattern, the second shading pattern, the third shading pattern, and the third metal pattern are spaced apart sequentially; and wherein the first buffer pattern is disposed on the second shading pattern, and a part of the first buffer pattern is disposed along a gap between the second metal pattern and the second shading pattern, the second buffer pattern is disposed on the third shading pattern, a part of the second buffer pattern is disposed along a gap between the second shading pattern and the third shading pattern, and another part of the second buffer pattern is disposed along a gap between the third shading pattern and the third metal pattern, and the third buffer pattern is disposed on the first shading pattern, a part of the third buffer pattern is disposed along a gap between the first metal pattern and the first shading pattern, and another part of the third buffer pattern is disposed along a gap between the first shading pattern and the second metal pattern.

9. The pixel driving circuit as claimed in claim 8, wherein in a direction perpendicular to the substrate, an overlapping area of the third gate pattern and the first shading pattern forms a storage capacitor.

10. A driving circuit, comprising:
a substrate;
a metal layer disposed on the substrate, wherein the metal layer comprises a first metal pattern, a first shading pattern, a second metal pattern, a second shading pattern, a third shading pattern, and a third metal pattern spaced apart from each other;
a buffer layer disposed on the metal layer, wherein the buffer layer comprises a first buffer pattern, a second buffer pattern, and a third buffer pattern, the first buffer pattern corresponds to the second shading pattern, the second buffer pattern corresponds to the third shading pattern, and the third buffer pattern corresponds to the first shading pattern;
a channel layer disposed on the buffer layer, wherein the source/drain layer comprises a first channel pattern, a second channel pattern, and a third channel pattern, the first channel pattern corresponds to the second shading pattern, the second channel pattern corresponds to the third shading pattern, and the third channel pattern corresponds to the first shading pattern;
a gate layer disposed on the channel layer, wherein the gate layer comprises a first gate pattern, a second gate pattern, and a third gate pattern spaced apart from each other, the first gate pattern is disposed on the first channel pattern, the second gate pattern is disposed on the second channel pattern, and the third gate pattern is disposed on the third channel pattern;
a passivation layer disposed on the gate layer and covering the channel layer and the buffer layer; and
an anode layer disposed on the passivation layer, wherein the anode layer comprises a first anode pattern and a second anode pattern;
wherein a first via hole and a second via hole are further formed in the passivation layer, the first via hole penetrates the passivation layer and the first gate pattern, the second via hole penetrates the passivation layer, the first anode pattern is connected to the second metal pattern through the first via hole to form a drain of a third transistor, and the second anode pattern is connected to the second shading pattern through the second via hole to form a drain of a first transistor and a drain of a second transistor.

11. The pixel driving circuit as claimed in claim 10, wherein an insulating layer is further disposed between the source/drain layer and the gate layer, and the insulating layer comprises a first insulating pattern, a second insulating pattern, and a third insulating pattern spaced apart from each other; and
wherein the first channel pattern, the first insulating pattern, and the first gate pattern are stacked on the first buffer pattern, the second channel pattern, the second insulating pattern, and the second gate pattern are stacked on the second buffer pattern, the third channel pattern, the third insulating pattern, and the third gate pattern are stacked on the third buffer pattern, the first gate pattern is electrically connected to the third channel pattern through the first anode pattern, the first channel pattern is electrically connected to the second channel pattern through the second shading pattern, the second shading pattern is connected to the second anode pattern, and the third channel pattern is connected to the first anode pattern through the second metal pattern.

12. The pixel driving circuit as claimed in claim 11, wherein the first metal pattern, the first shading pattern, the second metal pattern, the second shading pattern, the third shading pattern, and the third metal pattern are spaced apart sequentially; and
wherein the first buffer pattern is disposed on the second shading pattern, and a part of the first buffer pattern is disposed along a gap between the second metal pattern and the second shading pattern, the second buffer pattern is disposed on the third shading pattern, a part of the second buffer pattern is disposed along a gap between the second shading pattern and the third shading pattern, and another part of the second buffer pattern is disposed along a gap between the third shading pattern and the third metal pattern, and the third buffer pattern is disposed on the first shading pattern, a part of the third buffer pattern is disposed along a gap between the first metal pattern and the first shading pattern, and another part of the third buffer pattern is disposed along a gap between the first shading pattern and the second metal pattern.

13. The pixel driving circuit as claimed in claim 12, wherein in a direction perpendicular to the substrate, an overlapping area of the third gate pattern and the first shading pattern forms a storage capacitor.

14. The pixel driving circuit as claimed in claim 11, wherein a material of the channel layer comprises oxide semiconductor and polycrystalline silicon.

* * * * *